United States Patent
Lim

(10) Patent No.: US 9,234,944 B2
(45) Date of Patent: Jan. 12, 2016

(54) SOC CORRECTING SYSTEM HAVING MULTIPLE PACKS IN PARALLEL

(75) Inventor: Jae Hwan Lim, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 244 days.

(21) Appl. No.: 14/000,734

(22) PCT Filed: Feb. 17, 2012

(86) PCT No.: PCT/KR2012/001189
§ 371 (c)(1),
(2), (4) Date: Sep. 17, 2013

(87) PCT Pub. No.: WO2012/115393
PCT Pub. Date: Aug. 30, 2012

(65) Prior Publication Data
US 2014/0002095 A1    Jan. 2, 2014

(30) Foreign Application Priority Data
Feb. 22, 2011    (KR) .......................... 10-2011-0015591

(51) Int. Cl.
| | |
|---|---|
| G01N 27/416 | (2006.01) |
| H02J 7/00 | (2006.01) |
| G01R 31/36 | (2006.01) |
| B60L 3/00 | (2006.01) |
| B60L 11/18 | (2006.01) |

(52) U.S. Cl.
CPC ............ *G01R 31/3606* (2013.01); *B60L 3/0038* (2013.01); *B60L 11/1861* (2013.01); *B60L 11/1866* (2013.01); *G01R 31/362* (2013.01); *G01R 31/3658* (2013.01); *B60L 2240/545* (2013.01); *B60L 2240/547* (2013.01); *B60L 2240/549* (2013.01); *Y02T 10/7005* (2013.01); *Y02T 10/7044* (2013.01); *Y02T 10/7061* (2013.01)

(58) Field of Classification Search
CPC .......... G01R 31/36; H01M 10/48; H02J 7/00; H02J 7/02; H02J 7/04
USPC ................................... 320/132, 116; 324/434
See application file for complete search history.

(56) References Cited

U.S. PATENT DOCUMENTS

| | | | | |
|---|---|---|---|---|
| 5,892,351 | A * | 4/1999 | Faulk ............................ | 320/125 |
| 6,737,831 | B2 * | 5/2004 | Champlin ..................... | 320/132 |
| 2004/0119441 | A1 | 6/2004 | Koo | |
| 2010/0055543 | A1 * | 3/2010 | Tae et al. ........................ | 429/50 |
| 2010/0134070 | A1 | 6/2010 | Yun et al. | |
| 2012/0133332 | A1 * | 5/2012 | Ogane et al. .................. | 320/134 |

FOREIGN PATENT DOCUMENTS

| | | |
|---|---|---|
| KR | 1020070006953 A | 1/2007 |
| KR | 1020070095612 A | 10/2007 |
| KR | 1020100093464 A | 8/2010 |

\* cited by examiner

*Primary Examiner* — M'Baye Diao
(74) *Attorney, Agent, or Firm* — The Webb Law Firm

(57) ABSTRACT

A SOC correcting system in a parallel structure of multiple packs in which a plurality of sub-packs having serially connected cells are connected in parallel. The system includes sub BMSs connected to each of the sub-packs a main BMS connected to each of the sub BMSs to collect the SOCs calculated in each of the sub BMSs and to transmit a final SOC to a vehicle SOC to a vehicle controller. When an average SOC to each SOC of the sub-packs is less than 50%, the main BMS determines a minimum value among the SOCs of the sub-packs as a final SOC, and when the average SOC to each SOC of the sub-packs is 50% or more, the main BMS determines a maximum value among the SOCs of the sub-packs as a final SOC.

5 Claims, 3 Drawing Sheets

SOC CORRECTING SYSTEM HAVING MULTIPLE PACKS IN PARALLEL

CROSS-REFERENCE TO RELATED APPLICATIONS

This application is the United States national phase of International Application No. PCT/KR2012/001189 filed, Feb. 17, 2012, and claims priority to Korean Patent Application No. 10-2011-0015591 filed Feb. 22, 2011, the disclosures of which are hereby incorporated in their entirety by reference.

TECHNICAL FIELD

The present invention relates to a State Of Charge (SOC) correcting system having multiple packs in parallel, and more particularly, to a SOC correcting system having multiple packs in parallel that solves problems that when a voltage value indicates about 0 to 0.5V due to a cell voltage sensing error, a sum of electromotive forces of sub-packs lowers, that there is an error that a final SOC is corrected to be low to make energy consumption impossible, and that a vehicle controller is controlled by a SOC error value to cause imbalance of the multiple packs, and a SOC width is remarkably widened due to a parallel structure of the multiple packs.

BACKGROUND ART

A vehicle employing an internal combustion engine that uses gasoline and heavy oil as a main fuel causes too much pollution including air pollution. Recently, a lot of efforts have been put into developing an electric car or a hybrid electric vehicle (HEV) in order to reduce environmental pollution.

A high power secondary battery using non-aqueous liquid electrolyte of high energy consumption density has been recently developed. A plurality of high power secondary batteries are connected in serial to form a high-capacity secondary battery to be used in a device requiring high power for driving a motor such as the electric car.

As described above, one high-capacity secondary battery, which is hereinafter called "battery", is generally formed of many batteries connected in serial. In case of the battery, particularly, the battery for HEV, it is required to be managed to maintain a proper operation state by controlling charging and discharging since several or tens of batteries alternatively perform charging and discharging Accordingly, a Battery Management System (BMS) manages a general status of the batteries. The BMS estimates State of Charge (SOC) through an operation by detecting voltage, current, and temperature of the batteries, and controls the SOC of the battery such that a vehicle has the best fuel efficiency. The charging and discharging battery needs to be accurately measured to precisely control the SOC.

As a prior art, "a method for resetting soc of a secondary battery module" is disclosed in KR Patent Application No. 2005-0061123 (filed on Jul. 7, 20005).

The prior art provides a method for resetting SOC of a secondary battery module, comprising of: measuring a temperature value, a voltage value and a current value of battery modules during operation to accurately calculate SOC of a battery; calculating initial SOC based on the measured value; integrating currents; calculating actual SOC based on the integration value of currents; checking whether the battery module is in a non-load condition; when the battery module is in a non-load condition, checking whether the actual SOC is within a range of setting that it is measurably by integrating currents; and when the actual SOC is out of the range of setting, measuring a voltage value and calculating SOC based on the measured voltage value.

Generally, errors do not much occur in SOCi in the short term. However, as shown in FIG. 1, since the errors tend to be continuously integrated, a great deal of errors may occur in case that the battery operates for a long time. The integrated errors occur mainly when the battery is not completely charged or discharged. It is because errors due to skip of LBS digit in CPU for calculating SOC or reduction of charging amount by self-discharge largely affects accuracy. Also, the SOC accuracy greatly depends on a current measuring sensor. Accordingly, it is not possible to correct errors when there is a problem in the sensor.

On the other hand, as shown in FIG. 2, in case of SOCv, SOC is measured through electromotive force. This measuring method obtains an accurate result when current does not flow.

While current flows, accuracy in calculating of SOCv depends on charging and discharging patterns of the battery. Accordingly, the SOC may be less accurate according to the charging and discharging patterns. Since the charging and discharging patterns affecting the accuracy of SOCv are within a general usage range of a battery, it may cause many errors to use only the SOCv.

DISCLOSURE OF INVENTION

Technical Problem

The present invention is invented to improve the prior arts described above and an embodiment of the present invention is to provide a State Of Charge (SOC) correcting system having multiple packs in parallel that solves problems that when a voltage value indicates about 0-0.5V due to a cell voltage sensing error, a sum of electromotive forces of sub-packs lowers, that there is an error that a final SOC is corrected to be low to make energy consumption impossible, and that a vehicle controller is controlled by a SOC error value to cause imbalance of the multiple packs, and a SOC width is remarkably widened due to a parallel structure of the multiple packs.

Solution to Problem

To achieve the embodiment of the present invention, the present invention provides a State Of Charge (SOC) correcting system in a parallel structure of multiple packs that a plurality of sub-packs having serially connected correcting system in a parallel structure of multiple packs that a plurality of sub-packs having serially connected cells are connected in parallel, including: sub Battery Management Systems (BMSs) connected to each of the sub-packs to calculate each SOC of the sub-packs; and a main BMS connected to each of the sub BMSs to collect the SOCs calculated in each of the sub BMSs and transmit a final SOC to a vehicle controller, wherein when an average SOC to each SOC of the sub-packs is less than 50%, the main BMS determines a minimum value among the SOCs of the sub-packs as a final SOC, and when the average SOC to each SOC of the sub-packs is 50% or more, the main BMS determines a maximum value among the SOCs of the sub-packs as a final SOC.

When a cell voltage sensed by a plurality of voltage sensors included in each of the sub-packs is 0.5V or less, the sub BMSs determine that there is a sensing error in the corresponding voltage sensor.

The sub BMSs sum up cell voltages sensed by the voltage sensor, which does not have no sensing error, among the voltage sensors included in each of the sub-packs, divide the sum of the cell voltages by the number of voltage sensors, which do not have no sensing error, to obtain one cell voltage, and calculate the SOC of the corresponding sub-packs based on the calculation.

When a cell voltage sensed by the voltage sensors included in each of the sub-packs is 0.5V or less, the sub BMSs transmit a check code to the main BMS and the main BMS transmits a check code to the vehicle controller.

The main BMS applies a correction rate as a change rate of the final SOC to the final SOC to correct that the final SOC is remarkably changed.

Advantageous Effects of Invention

A State Of Charge (SOC) correcting system having multiple packs in parallel may achieve the effect that solves problems that when a voltage value indicates about 0~0.5V due to a cell voltage sensing error, a sum of electromotive forces of sub-packs lowers, that there is an error that a final SOC is corrected to be low to make energy consumption impossible, and that a vehicle controller is controlled by a SOC error value to cause imbalance of the multiple packs, and a SOC width is remarkably widened due to a parallel structure of the multiple packs.

BRIEF DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS 10 to 100: sub-packs
110 to 200: sub BMS
300: main BMS

BEST MODE FOR CARRYING OUT THE INVENTION

The present invention may be diversely modified and have a plurality of exemplary embodiments. Accordingly, specific exemplary embodiments will be exemplified on accompanying drawings and described in detail. However, it will be apparent that the present invention is not limited to the above exemplary embodiments. It will be understood that modifications, equivalents and substitutions for components of the specifically described embodiments of the present invention may be made by those skilled in the art without departing from the spirit and scope of the present invention.

When it is mentioned that any constituent element "is connected to" or "is in contact with" another constituent element, the former may be directly connected to or in contact with the latter. Otherwise, it will be understood that any other constituent elements may exist between the former and the latter.

On the other hand, when it is mentioned that any constituent element "is directly connected to" or "is directly in contact with" another constituent element, it will be understood that there is no constituent element between the former and the latter.

The terms used in this specification is provided to describe the specific exemplary embodiments but they are not provided to limit the scope of the present invention. A singular number includes a plural number unless a concise and apparent meaning is given to the expression.

In this application, it will be understood that the terms "include" or "have" indicate that features, numerals, processes, operations, constituent elements, components or combinations thereof described in the specification exist but does not exclude existing of other features, numerals, processes, operations, constituent elements, components or combinations thereof or additional possibilities.

Unless otherwise defined, all terms including technical or scientific terms used herein have the same meaning as those generally understood by those skilled in the art of the present invention. It will be also understood that such terms that are generally used and defined in the dictionary have contextually identical meaning with the words of related technologies. Unless clearly defined in this application, they will not be understood as ideological or overly formal meanings.

The exemplary embodiments of the present invention will be described in detail with reference to accompanying drawings.

Figure 1:
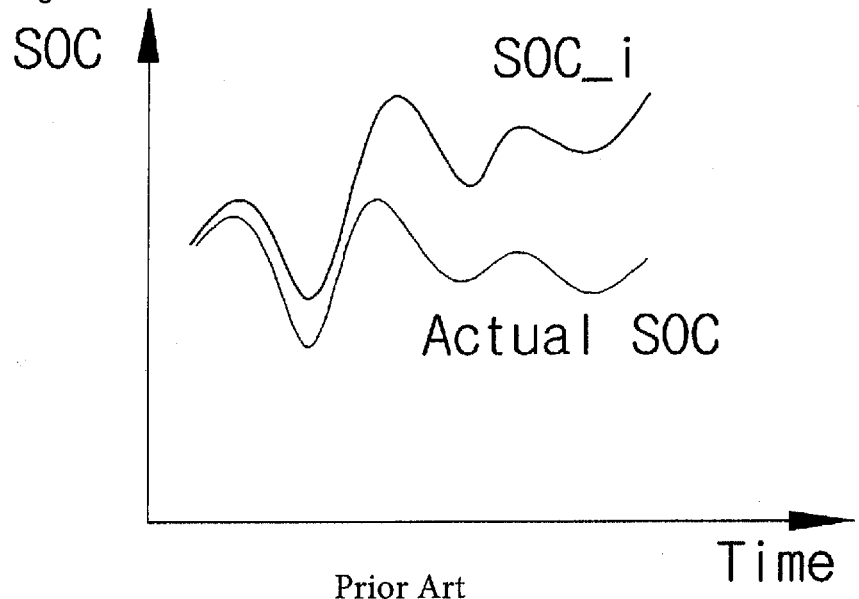
FIG. 1 is a graph illustrating a case that a conventional SOCi is set up as battery SOC.
Figure 2:
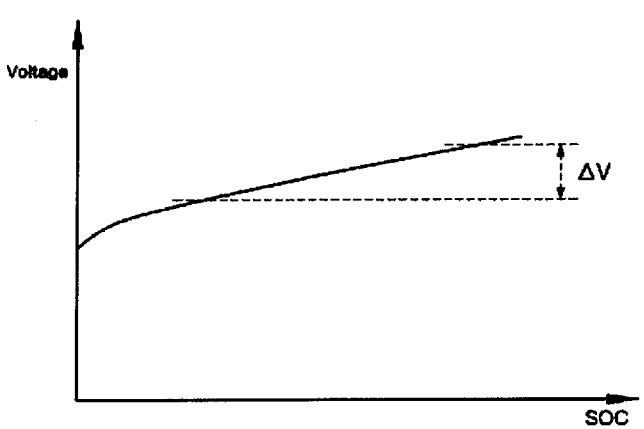
FIG. 2 is a graph illustrating a case that the battery SOC is corrected by conventional SOCv.
Figure 3:
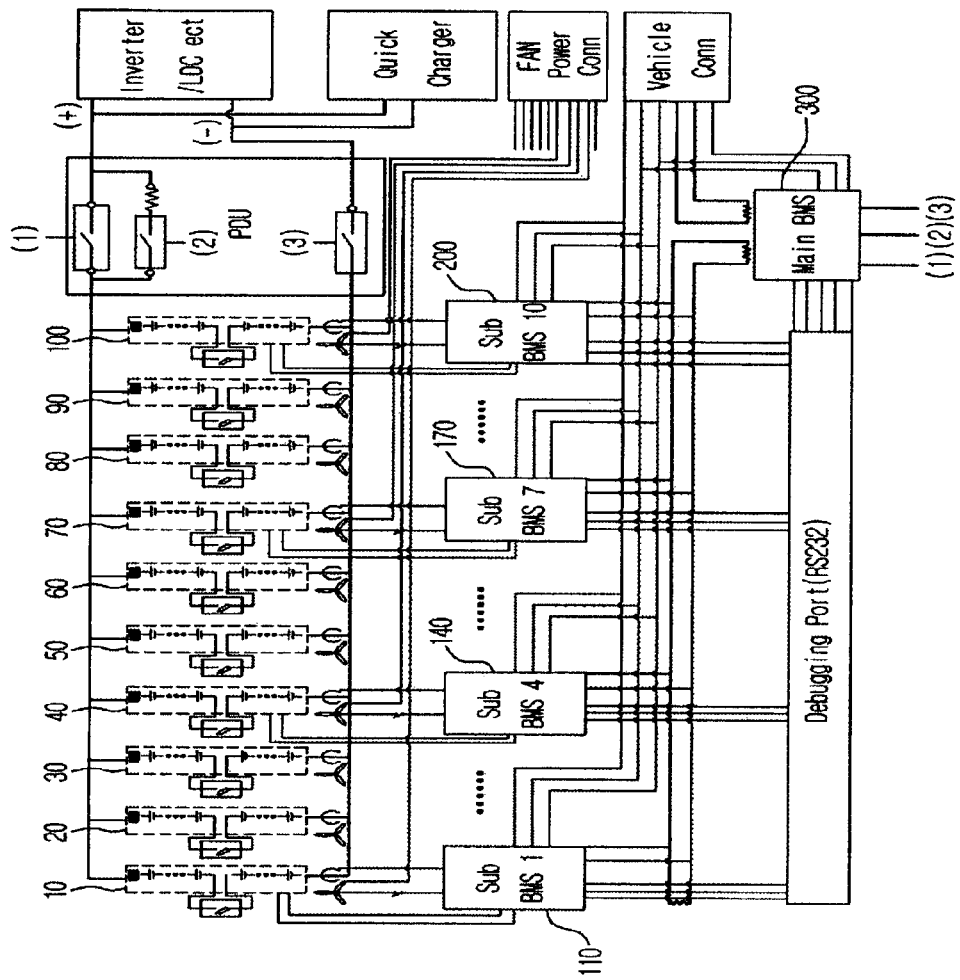
FIG. 3 shows a parallel structure of multiple packs according to an exemplary embodiment.

FIG. 3 shows a parallel structure of multiple packs according to an exemplary embodiment.

Figure 4:
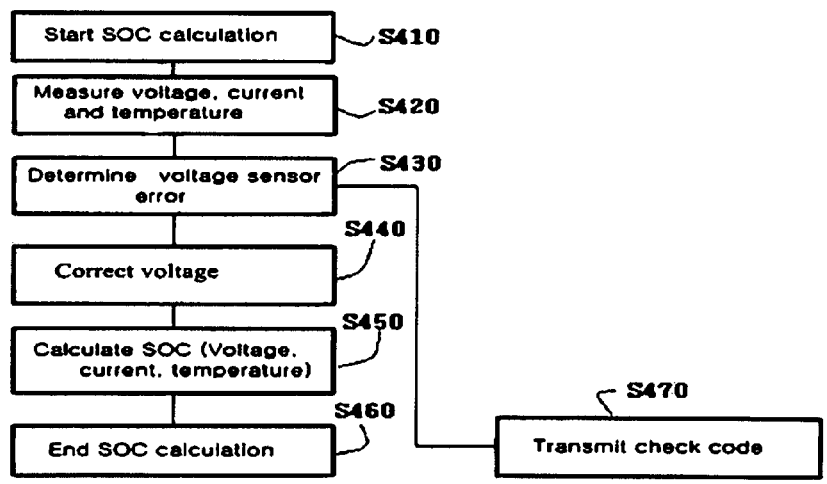
FIG. 4 is a flowchart describing a SOC calculating procedure in a sub Battery Management System (BMS)

FIG. 4 is a flowchart describing a SOC calculating procedure in a sub Battery Management System (BMS)

Figure 5:
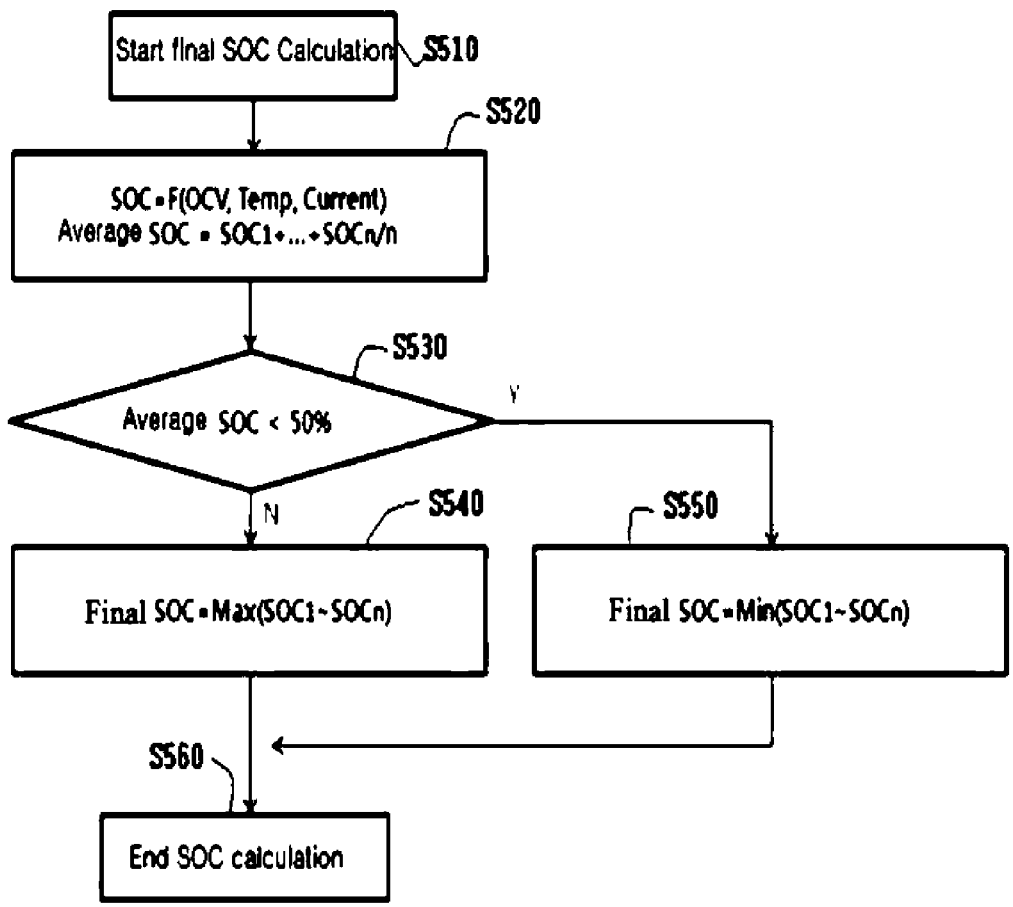
FIG. 5 is a flowchart describing a final SOC computing procedure in a main BMS.

FIG. 5 is a flowchart describing a final SOC computing procedure in a main BMS.

Figure 6:
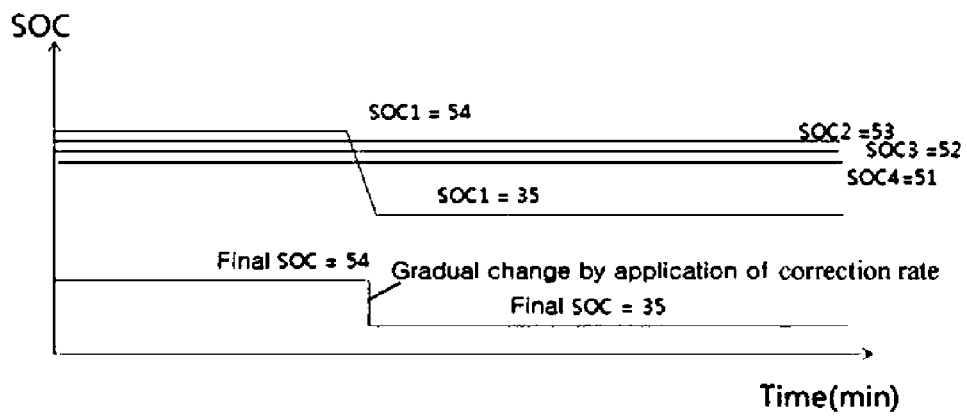
FIG. 6 shows an example of a final SOC operation when cell voltage sensing errors occur.

FIG. 6 shows an example of a final SOC operation when cell voltage sensing errors occur.

In the parallel structure of the multiple packs according to an exemplary embodiment, a plurality of sub-packs 10 to 100 are connected in parallel as shown in FIG. 3. Each of the sub-packs 10 to 100 is formed by connecting a plurality of cells in serial. For example, each of the sub-packs 10 to 100 has a configuration that 100 cells are connected in serial.

Each of the sub-packs 10 to 100 includes sub BMSs 110 to 200 for calculating each SOC of the sub-packs 10 to 100 by measuring current, temperature and voltage of the corresponding cell.

For example, a first sub-pack 10 is connected to a first sub BMS 110 for measuring SOC of the corresponding sub-pack 10. A fourth sub-pack 40 is connected to a fourth sub BMS 140 for measuring SOC of the corresponding sub-pack 40. Each SOC of the sub BMSs 110 to 200 may adopt a calculating logic by current integration or voltage correction.

Accordingly, each SOC calculated in the sub BMSs 110 to 200 is transferred to a main BMS 300. The main BMS 300 transfers a final SOC to a vehicle controller and controllers except multiple packs based on the received SOC. The main BMS 300 starts calculating each SOC transmitted from the sub BMSs 110 to 200 at step S510 and computes an average of the SOC at step S520. A final SOC is determined based on the calculation result (see FIG. 5).

When an average SOC to each SOC of the sub-packs 10 to 100 is less than 50% at step S530, the main BMS 300 determines a minimum value among the SOCs of the sub-packs 10 to 100 as a final SOC at step S550.

When an average SOC to each SOC of the sub-packs 10 to 100 is 50% or more, the main BMS 300 determines a maximum value among the SOCs of the sub-packs 10 to 100 as a final SOC at step S540.

For easy understanding, it is assumed that the number of the sub-packs and the sub BMSs are limited to 4 and the main BMS receives SOCs of 51%, 52%, 53%, and 54% from the four sub BMSs. Since an average value of the SOCs is 52%, which is a value higher than 50%, a maximum value 54% of the SOCs 51%, 52%, 53%, and 54% is determined as a final SOC.

As described above, if the number of the sub-packs and the sub BMSs are limited to 4 and the main BMS receives SOC values of 35%, 51%, 52%, and 53% from the four sub BMSs, a minimum value 35% of the SOCs 35%, 51%, 52%, and 53% is determined as a final SOC since an average value of the SOCs is 48%, which is a value less than 50% (see FIG. 6).

The SOC correcting system according to the present invention intends to improve SOC calculating errors, which occur due to a voltage sensing error of many cells in each of the sub BMSs 110 to 200 in the parallel structure of multiple packs, and SOC errors, which are changed on the basis of the SOC 50% in the main BMS 300.

In the SOC calculating of the sub BMSs 110 to 200, cell voltages measured in each cell, which has no voltage sensing error, are added and the voltages are corrected by a value formed by voltage of the corresponding sub-packs 10 to 100.

When a cell voltage indicates 0 to 0.05V or less due to disorder of the voltage sensor, the sum of the voltages in the corresponding sub-packs 10 to 100 is changed to cause errors in the determined final SOC as well as the SOC of the corresponding sub BMSs 110 to 200.

For example, if there is an error in a voltage sensor included in the first sub-pack 10 to change the sum of voltages of the first sub-pack 10, an error occurs in the SOC of the first sub BMS 110 calculated based on the sum and then an error occurs in the final SOC.

In order to solve the problem, as shown in FIG. 4, SOC calculation begins at step S410 and cell voltage, each current and temperature of the sub packs 10 to 100 are measured. Subsequently, when a cell voltage sensed by a plurality of voltage sensors included in each of the sub-packs 10 to 100 is 0.5V or less, the sub BMSs 110 to 200 determine at step S430 that there is a sensing error in the corresponding voltage sensor.

As described above, the sub BMSs 110 to 200 perform voltage correcting due to the cell voltage sensing error. The sub BMSs 110 to 200 sum up cell voltages sensed by the voltage sensor, which does not have sensing error, among the voltage sensors included in each of the sub-packs 10 to 100. The sum of the cell voltages is divided by the number of voltage sensors, which do not have sensing error, to obtain one cell voltage. Based on such calculation, the SOC of the corresponding sub-packs 10 to 100 is calculated at steps S440 and S450.

When a cell voltage sensed by the voltage sensors included in each of the sub-packs 10 to 100 is 0.5V or less, the sub BMSs 110 to 200 may transmit a check code to the main BMS 300 and the main BMS 300 may transmit a check code to a vehicle controller at step S470.

As described above, the main BMS 300 calculates a final SOC based on a SOC equation suggested in the chart. There is a problem that a remarkable change may occur in the final SOC due to the parallel structure of the multiple packs at a point that the SOC is 50%. A change rate of the SOC may be controlled to be gradual in order to reduce the remarkable change.

For example, as shown in FIG. 6, when the SOC calculated in the first sub BMS 110 is changed from 54% to 35% due to an error in the voltage sensor of the first sub-pack 10, the final SOC is changed as much as 19% at one point. That is, since an average of 51%, 52%, 53%, and 54% is 52%, which is more than 50%, 54% is selected as the maximum value, and since an average of 35%, 51%, 52%, and 53% is 48%, which is less than 50%, 35% is selected as the minimum value. A correction rate of %/100 ms may be applied to minimize the remarkable change of the final SOC. Accordingly, the final SOC may be gradually changed from 54% to 35% at the rate of %/100 ms.

The invention claimed is:

1. A State Of Charge (SOC) correcting system in a parallel structure of multiple packs that a plurality of sub-packs having serially connected cells are connected in parallel, the system comprising:
    sub Battery Management Systems (BMSs) connected to each of the sub-packs to calculate each SOC of the sub-packs; and
    a main BMS connected to each of the sub BMSs to collect the SOCs calculated in each of the sub BMSs and transmit a final SOC to a vehicle controller,
    wherein when the average SOC to each SOC of the sub-packs is less than 50%, the main BMS determines a minimum value among the SOCs of the sub-packs as a final SOC, and
    when an average SOC to each SOC of the sub-packs is 50% or more, the main BMS determines a maximum value among the SOCs of the sub-packs as a final SOC.

2. The SOC correcting system of claim 1, wherein when a cell voltage sensed by a plurality of voltage sensors included in each of the sub-packs is 0.5V or less, the sub BMSs determine that there is a sensing error in the corresponding voltage sensor.

3. The SOC correcting system of claim 1, wherein the sub BMSs sum up cell voltages sensed by the voltage sensor, which does not have sensing error, among the voltage sensors included in each of the sub-packs, divide the sum of the cell voltages by the number of voltage sensors, which do not have sensing error, to obtain one cell voltage, and calculate the SOC of the corresponding sub-packs based on the calculation.

4. The SOC correcting system of claim 1, wherein when a cell voltage sensed by the voltage sensors included in each of the sub-packs is 0.5V or less, the sub BMSs transmit a check code to the main BMS and the main BMS transmits a check code to the vehicle controller.

5. The SOC correcting system of claim 1, wherein the main BMS applies a correction rate as a change rate of the final SOC to the final SOC to correct that the final SOC is remarkably changed.

* * * * *